United States Patent [19]

Riley et al.

[11] 4,180,428

[45] Dec. 25, 1979

[54] METHOD FOR MAKING HOT-PRESSED FIBER-REINFORCED CARBIDE-GRAPHITE COMPOSITE

[75] Inventors: Robert E. Riley; Terry C. Wallace Sr., both of Los Alamos, N. Mex.

[73] Assignee: The United States of America as represented by the United States Department of Energy, Washington, D.C.

[21] Appl. No.: 918,258

[22] Filed: Jun. 23, 1978

[51] Int. Cl.² ............... B32B 31/12; C01B 31/30
[52] U.S. Cl. .................................... 156/281; 427/249
[58] Field of Search ................... 427/249; 156/281

[56] References Cited

U.S. PATENT DOCUMENTS

| 3,294,880 | 12/1966 | Turkat | 264/29 |
| 3,369,920 | 2/1968 | Bourdeau et al. | 117/46 |
| 3,991,248 | 11/1976 | Bauer | 427/249 X |

Primary Examiner—James R. Hoffman
Attorney, Agent, or Firm—Dean E. Carlson; Paul D. Gaetjens

[57] ABSTRACT

A method for the chemical vapor deposition of a uniform coating of tantalum metal on fibers of a woven graphite cloth is described. Several layers of the coated cloth are hot pressed to produce a tantalum carbide-graphite composite having a uniformly dispersed, fine grained tantalum carbide in graphite with compositions in the range of 15 to 40 volume percent tantalum carbide.

5 Claims, No Drawings

METHOD FOR MAKING HOT-PRESSED FIBER-REINFORCED CARBIDE-GRAPHITE COMPOSITE

BACKGROUND OF THE INVENTION

1. Field of the Invention

In some high temperature applications, for example, rocket nozzles, turbines or bearings, there is a need for materials which have high resistance to ablation, erosion, and thermal shock. While woven carbon-carbon composites have excellent ablation and thermal shock resistance, their erosion resistance is poor. Alternatively, carbides have excellent erosion resistance but poor ablation and thermal shock resistance.

The prior art shows that hot pressed carbide-graphite composites can be formed from blends of carbide and graphite powders and do have improved properties over the individual constituents, i.e., carbide or graphite. For many applications, however, further improvement of the thermal shock resistance is a necessity. Filaments which reinforce woven bodies would improve the hot press powder constituent bodies but filaments up to now have been very difficult to distribute uniformly by blending with the individual carbide or graphite powders.

2. Prior Art

1. U.S. Pat. No. 3,369,920, Bourdeau et al., describes a process for depositing pyrolytic coatings on carbon and graphite filaments by depositing said coatings at a temperature between 1300° and 2100° C. at a pressure of less than 100 millimeters of mercury using a diluent gas, said gas selected from the group consisting of the hydrocarbons and halides of tantalum, zirconium, niobium, hafnium, tungsten, silicon, and boron. The composite material of this patent is formed at high temperatures, i.e., 1300°–2100° C., while applicants' method is directed to the depositing of a tantalum metal on a graphite cloth at a temperature in the range of 650° to 900° C. The temperature is a critical limitation of applicants' process since at temperatures beyond 900° C. the coating atmosphere attacks or degrades the graphite cloth. In addition, the composite of the Bourdeau patent is not fully dense and as a consequence does not have the high strength of applicants' composite.

2. U.S. Pat. No. 3,294,880, Michael Turkat, describes a method of forming continuous lengths of a pure crystalline filament of pyrolytic graphite, pyrolytic carbides, and combinations thereof by cracking hydrocarbon gases in a vacuum furnace at temperatures in the range of 1900° to 2300° C., and depositing the decomposition products thereof on said filament. In contrast, the graphite of applicants' process is not isotropic and hence is less susceptible to stress failures experienced with a pyrolytic graphite-carbide composite.

SUMMARY OF THE INVENTION

This invention describes a method of fabricating a tantalum carbide-graphite composite by first coating a graphite cloth with tantalum metal and then hot pressing several layers of the coated cloth into a dense, fiber reinforced composite. The tantalum metal is converted to tantalum carbide during hot pressing. The tantalum metal is deposited on the graphite cloth at a temperature in the range of 650° to 900° C. and at a pressure in the range of 0.01 to 0.13 atmospheres in the presence of a diluent inert gas such as argon.

DESCRIPTION OF THE PREFERRED EMBODIMENT

The coater used in the method of this invention consists of a nickel tube supported in a three-zone furnace. A segmented graphite sleeve with clamping features for holding the graphite speciment is inserted into the nickel tube. Temperature is measured with three thermocouples located one in each of the three zones of the furnace. Hydrogen is passed through various control valves, a flow meter, and is mixed with tantalum pentachloride in a baffle region of this furnace. The baffle also serves as a preheater for the processed gases. In addition, there is a pressure transducer connected to the hydrogen line downstream from the last control valve which permits the measurement of the total pressure at the inlet side of the coating furnace. Chlorine and argon are passed separately through various control valves, flow meters, and mixed prior to entering the chlorination chamber. The chlorinator is maintained at a temperature of 415°–430° C. Tantalum pentachloride is quantitatively produced by the reaction of chlorine with tantalum metal chips in the chlorinator. The tantalum pentachloride is converted to tantalum tetrachloride upon mixing with the hydrogen gas. Thus the product gas entering the coating chamber consists of tantalum tetrachloride, hydrogen, gaseous hydrogen chloride and argon. The graphite cloth which is to be coated with the tantalum metal has a plain weave, a gauge of 56 mm, and each yarn bundle contains 1440 filaments with each filament of 9 micrometers. The density of the filaments is about 1.4 g/cm$^3$ and a stack of 130 layers of graphite cloth is contained at one time in the coating chamber. The stacks of cloth are inserted into the graphite liner tube and are supported top and bottom with other pieces of graphite cloth fixed to the graphite tube. The coater inlet pressure, as measured by the transducer in the hydrogen line, is maintained between 0.01 and 0.3 atmosphere by the manual adjustment of an exhaust valve located between the pump and the coated. The pressure of the coater at the exit side is 0.03 atmosphere. A rotary vacuum pump is used to obtain low pressures in the coater. To prevent backstream of water vapor from the pump, a secondary supply of argon gas is introduced through a jet upstream of the pressure regulating valve. This pump arrangement serves the dual function of providing the required low pressure, which is critical to applicants' process, while at the same time scrubbing the corrosive, but water soluble, effluent gases. The weight of tantalum metal deposited is represented by the equation $$W = An^B$$

where $$W = \frac{\sum_{1}^{n} \Delta W_n}{t} \text{ g/min}$$

$n =$ layer number $t =$ coating run time

The tantalum-coated graphite cloth is then hot pressed and the tantalum is converted to tantalum carbide. The volume percent of tantalum carbide is in the range of 15–40 volume percent. The stack of cloth is hot pressed at a temperature of 300° C. and at a pressure of 300 psi Mpa for 10 minutes. The time, temperature, and pressure are not critical in that a metal bond must be formed between the graphite and the tantalum carbide in order to maximize the mechanical and physical properties of the composite.

Photomicrographs of the tantalum carbide-graphite cloth in the 15–40 volume percent range show a fine gained uniform distribution of the carbide with the carbide appearing quite dense with only minor voids. The fine grained uniform dispersion of the carbide is maintained throughout with grain size becoming smaller with the lower volume percent concentrations of the carbide. The filament coating thickness is essentially uniform across the yarn bundle. The controlling step for the deposition process throughout the stack of yarn is the specific surface reaction rate and not the diffusion of gaseous reactants through the yarn bundle. At the low pressures 0.01 to 0.3 atmospheres used in this method, the reactant gases coat all the filaments with a near uniform thickness of tantalum metal.

The specific parameters needed to achieve a uniform coating of chemical vapor deposited tantalum metal on filaments of woven cloth, specifically the pressure, composition, and temperature, are given in the following table.

TABLE

| Vol % TaC in Comp. | Ta Coat Time (min) | Density of Comp (g/cm³) | Room Temp. Flex Strength (ksi) |
|---|---|---|---|
| 15 | 31 | 3.3 | 3 |
| 25 | 52 | 4.4 | 5 |
| 40 | 83 | 6.9 | 19 |

Using a coating gas whose composition is 4 volume percent tantalum pentachloride; 4 volume percent hydrogen chloride; 82 volume percent hydrogen gas; and 10 volume percent argon; a deposition temperature of 800° C.; and a deposition pressure of 0.16 atmospheres, graphite cloth was coated with tantalum metal as a precursor step in the fabrication of the hot pressed tantalum carbide-graphite composite. The hydrogen chloride gas controls the deposition rate of the tantalum metal on the graphite cloth and is essential to the process when working at elevated temperatures (above 800° C.). In general, the coating gas composition may be varied within the following ranges:

Tantalum pentachloride-0.5 to 5.0 volume percent;
hydrogen chloride gas-0 to 25 volume percent;
hydrogen gas-50-95 volume percent; and
inert diluent gas (argon) 0 to 50 volume percent. The deposition temperature of the tantalum metal on the graphite cloth muxt be done between 650° to 900° C. while the deposition pressure must be maintained between 0.01 to 0.3 atmosphere.

The foregoing examples are not intended in any way to limit the scope of the invention but rather are presented for the purpose of meeting the enablement and best mode requirements of 35 U.S.C. 112. The scope of the invention is as set forth in the Summary of the Invention and the broad claims appended hereto.

What we claim is:

1. An improved method for making a hot pressed, fiber-reinforced carbide-graphite composite being 15 to 40 volume percent Ta carbide, said improvement comprising:
   (a) contacting multiple layers of filaments of a graphite cloth with a gas having the following range of composition by volume percent
   (I) 0.5 to 5.0-tantalum pentachloride
   (II) 0 to 25-hydrogen chloride (gas)
   (III) 50 to 95-hydrogen and
   (IV) 0 to 50-inert gas,
   (b) the said gas reacting with the filaments to form a coating, said coating being formed in a temperature range of 650° to 900° C.,
   (c) at a pressure of 0.01 to 0.3 atmosphere,
   (d) the coating time dependent on the amount of Ta carbide formed in the composite, and then,
   (e) hot pressing multiple layers of filaments at a temperature of about 3000° C., a pressure of about 3000 psi, for a period of about 10 minutes.

2. The method of claim 1 in which the said gas has a composition of:
   (I) 4 volume percent tantalum pentachloride
   (II) 4 volume percent hydrogen chloride
   (III) 82 volume percent hydrogen gas
   (IV) 10 volume percent argon, a pressure of 0.16 atmosphere, and temperature of 800° C.

3. The method of claim 2 in which the coating time is approximately 30 minutes, and the TaC is 15 volume percent of the composite.

4. The method of claim 2 in which the coating time is approximately 50 minutes and the TaC is 25 volume percent of the composite.

5. The method of claim 2 in which the coating time is approximately 80 minutes, and the TaC is 40 volume percent of the composite.

* * * * *